(12) United States Patent
Tai et al.

(10) Patent No.: US 10,372,533 B2
(45) Date of Patent: Aug. 6, 2019

(54) NON-VOLATILE MEMORY APPARATUS AND EMPTY PAGE DETECTION METHOD THEREOF

(71) Applicant: VIA Technologies, Inc., New Taipei (TW)

(72) Inventors: Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 105 days.

(21) Appl. No.: 15/221,598

(22) Filed: Jul. 28, 2016

(65) Prior Publication Data

US 2017/0277589 A1    Sep. 28, 2017

Related U.S. Application Data

(60) Provisional application No. 62/313,828, filed on Mar. 28, 2016.

(51) Int. Cl.
  *G06F 11/10* (2006.01)
  *H03M 13/11* (2006.01)
  *G11C 29/52* (2006.01)

(52) U.S. Cl.
  CPC ..... *G06F 11/1068* (2013.01); *H03M 13/1105* (2013.01); *H03M 13/1128* (2013.01); *G11C 29/52* (2013.01)

(58) Field of Classification Search
  CPC . G06F 11/1068; H03M 13/1105; G11C 29/52
  See application file for complete search history.

(56) References Cited

U.S. PATENT DOCUMENTS

| 2013/0254463 | A1 | 9/2013 | Matsunaga et al. |
| 2014/0310574 | A1 | 10/2014 | Yu et al. |
| 2015/0026540 | A1* | 1/2015 | Hsiao ................. G06F 11/1068 714/773 |
| 2015/0106556 | A1 | 4/2015 | Yu et al. |

(Continued)

FOREIGN PATENT DOCUMENTS

WO    2013026741    2/2013

OTHER PUBLICATIONS

"Notice of Allowance of Taiwan Counterpart Application", dated Apr. 17, 2017, p. 1-p. 3, in which the listed references were cited.

*Primary Examiner* — April Y Blair
*Assistant Examiner* — Rong Tang
(74) *Attorney, Agent, or Firm* — JCIPRNET (57) ABSTRACT

A non-volatile memory (NVM) apparatus and an empty page detection method thereof are provided. The NVM apparatus includes a NVM and a controller. The controller reads the content of a memory page of the NVM. The controller performs Low Density Parity Check (LDPC) decoding for at least one codeword of the memory page to obtain a decoded codeword and a check-result vector. The controller determines that the memory page is not an empty page when the LDPC decoding for the codeword is successful. The controller counts an amount of the bits being 1 (or 0) in the check-result vector when the LDPC decoding for the codeword is fail. Based on the amount of the bits being 1 (or 0) in the check-result vector, the controller determines whether the memory page is an empty page.

5 Claims, 5 Drawing Sheets

(56) References Cited

U.S. PATENT DOCUMENTS

| | | | |
|---|---|---|---|
| 2015/0106557 A1 | 4/2015 | Yu et al. | |
| 2015/0261613 A1* | 9/2015 | Tuers | G06F 9/4401 |
| | | | 713/2 |
| 2017/0149446 A1* | 5/2017 | Tao | H03M 13/1117 |

* cited by examiner

NON-VOLATILE MEMORY APPARATUS AND EMPTY PAGE DETECTION METHOD THEREOF

CROSS-REFERENCE TO RELATED APPLICATION

This application claims the priority benefit of U.S. provisional application Ser. No. 62/313,828, filed on Mar. 28, 2016. The entirety of the above-mentioned patent application is hereby incorporated by reference herein and made a part of this specification.

BACKGROUND

1. Technical Field

The technical field relates to a non-volatile memory, and more particularly, to a non-volatile memory apparatus and an empty page detection method thereof.

2. Description of Related Art

Comparing to a traditional hard drive disk (HDD) apparatus, a solid state drive (SSD) with a flash memory having characters such as fast read/write and low power consumption. The SSD is a usual data storage apparatus. During the operating procedure of the SSD, the system (firmware and hardware) of the SSD needs to maintain lots of updated management information, such as addresses mapping information, flash memory condition information and others. The said flash memory condition information includes programing/erasing count, valid page count and other condition information. The said updated management information would be disappeared with the unexpected power-off event. When the power supply is recovered, the system of the SSD needs to recover a state which is before the unexpected power-off event (e.g., the updated management information). Wherein, the system of the SSD needs to determine which memory page(s) has been written, or which memory page(s) has not been written (e.g., an empty page).

For some of the types of flash memory products, the logical value of every bit of erased memory cells is "1". Therefore, (the logical bit value of) all the bits of an erased memory page (i.e., a memory page having no data, or an empty page) should be "1". In general, the common empty page detection method would be counting an amount of bits being "1" in a content of one target memory page. And, if all bits in the content of the target memory page are "1", it is indicating that the target memory page is an empty page.

For other of the types of flash memory products, a scrambler is deposed in the flash memory apparatus. With the operation of the scrambler, the contents of memory pages are approximate random. Therefore, not all the bits of an empty page would be "1". And, clearly the foregoing common empty page detection method would not be suitable for the flash memory apparatus having the scrambler since the method cannot correctly determine whether the target memory page is an empty page according to the read content of the target memory page.

SUMMARY

The invention provides a non-volatile memory apparatus and an empty page detection method thereof which may correctly determine whether the memory page is an empty page.

According to an exemplary embodiment of the present invention, a non-volatile memory (NVM) apparatus is provided. The NVM apparatus includes a NVM and a controller. The controller coupled to the NVM, configured to perform an empty page detection method to determine whether a memory page of the NVM is an empty page. The controller reads a content of the memory page. The controller performs a Low Density Parity Check (LDPC) decoding for at least one codeword of the memory page to obtain a decoded codeword and a check-result vector. The controller determines that the memory page is not an empty page when the LDPC decoding for the at least one codeword is successful. The controller counts an amount of bits being 1 in the check-result vector, or counts an amount of bits being 0 in the check-result vector when the LDPC decoding for the at least one codeword is fail. The controller determines whether the memory page is an empty page based on the amount of the bits being 1 in the check-result vector, or based on the amount of the bits being 0 in the check-result vector.

According to an exemplary embodiment of the present invention, an empty page detection method is provided. The empty page detection method is used for determining whether a memory page of a NVM of a NVM apparatus is an empty page, wherein the NVM apparatus includes the NVM and a controller. The empty page detection method includes: reading a content of the memory page by the controller; performing a LDPC decoding for at least one codeword of the memory page by the controller to obtain a decoded codeword and a check-result vector; determining that the memory page is not an empty page by the controller when the LDPC decoding for the at least one codeword is successful; counting an amount of bits being 1 in the check-result vector, or counting an amount of bits being 0 in the check-result vector by the controller when the LDPC decoding for the at least one codeword is fail; and determining whether the memory page is an empty page by the controller based on the amount of the bits being 1 in the check-result vector, or based on the amount of the bits being 0 in the check-result vector.

Base on the foregoing description, the NVM apparatus and the empty page detection method provided in the present exemplary embodiments use the check-result vector of the LDPC decoding procedure. The controller may count an amount of bits being 1 (or 0) in the check-result vector when the LDPC decoding for the at least one codeword is fail. Accordingly, the controller may correctly determine whether the memory page is an empty page based on the amount of the bits being 1 (or 0) in the check-result vector.

Several exemplary embodiments accompanied with figures are described in detail below to further describe the disclosure in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 illustrates a exemplary flowchart of the empty page detection method in

FIG. 2 according to the embodiment.

DESCRIPTION OF THE EMBODIMENTS

In the following detailed description of the preferred embodiments, reference is made to the accompanying drawings which fowl a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
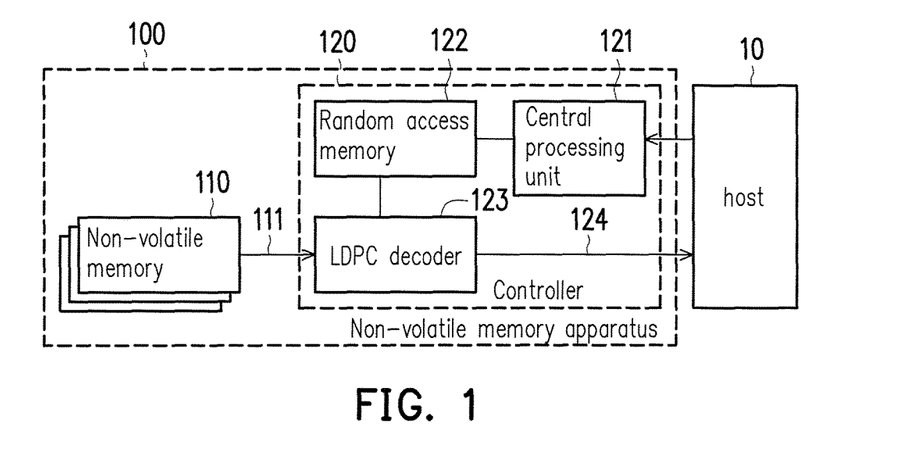
FIG. 1 illustrates a schematic circuit block diagram illustrating a non-volatile memory apparatus according to the embodiment.

FIG. 1 illustrates a schematic circuit block diagram illustrating a non-volatile memory (NVM) apparatus 100 according to the embodiment. In accordance with the design requirements, the NVM apparatus 100 may be a flash drive, solid state disc (SSD) or other storage device. The NVM apparatus 100 may be coupled to the host 10. The host 10 may be a computer 10, handheld phones, multimedia players, cameras or other electronic devices. When the host 10 issues a read command to a NVM apparatus 100, the NVM apparatus 100 may return data to the host 10 according to an address of the read command.

In the embodiment illustrated in FIG. 1, the NVM apparatus 100 includes a NVM 110 and a controller 120. In accordance with the design requirements, the NVM 110 may be a NAND flash memory or other non-volatile storing circuits/components. The controller 120 is coupled to the NVM 110. After the host 10 issuing a read command, the controller 120 may address the NVM 110 according to the read command to read a corresponding codeword 111 from the NVM 110. Then, the controller 120 performs a Low Density Parity Check (hereinafter referred to as LDPC) decoding for the corresponding codeword 111, to obtain a decoded codeword. The LDPC decoding can correct errors occurred during transmission. The LDPC decoding is a well-known technique in the art, and it is not repeated here.

$$v \cdot H^T = [\,v_0\ v_1\ \ldots\ v_{n-1}\,] \cdot \begin{bmatrix} h_{0,0} & h_{0,1} & \ldots & h_{0,n-1} \\ h_{1,0} & h_{1,1} & \ldots & h_{1,n-1} \\ \vdots & \vdots & \ddots & \vdots \\ h_{m-1,0} & h_{m-1,1} & \ldots & h_{m-1,n-1} \end{bmatrix}^T \quad \langle \text{Equation 1} \rangle$$

$$= [\,c_0\ c_1\ \ldots\ c_{m-1}\,]$$

After a (one time) LDPC decoding is completed, the controller 120 would obtain a decoded codeword v. The controller 120 may use Equation 1 to check the decoded codeword v to obtain a check-result vector $[c_0\ c_1\ \ldots\ c_{m-1}]$. The matrix H in Equation 1 is a parity-check matrix having a low density matrix characteristic. Element of the parity-check matrix H is "1" or "0", and the number of elements "1" is far less than the number of elements "0". The parity-check matrix H is a well-known art, and it is not repeated here. If the check-result vector $[c_0\ c_1\ \ldots\ c_{m-1}]$ is not a zero vector (i.e., a zero matrix, all elements $C_0$-$C_{m-1}$ of the matrix are "0"), the controller 120 may perform an iterative calculation (performing the LDPC decoding again) for the decoded codeword v to obtain a new decoded codeword v. The controller 120 may again use Equation 1 to check the new decoded codeword v to obtain a new check-result vector $[c_0\ c_1\ \ldots\ c_{m-1}]$. And so on, performing a plurality of iterative calculations till the check-result vector $[c_0\ c_1\ \ldots\ c_{m-1}]$ is the zero vector (the zero matrix), and then the iterative calculation would be terminated (i.e., the LDPC decoding for the corresponding codeword 111 is successful). When the LDPC decoding for the corresponding codeword 111 is successful, the decoded codeword 124 (the last decoded codeword v obtained by performing the last LDPC decoding/ iterative calculation) may be returned to the host 10.

When the number of the iterative calculations has reached a preset threshold number, if the check-result vector $[c_0\ c_1\ \ldots\ c_{m-1}]$ is not the zero vector yet, then the controller 120 may determine that the LDPC decoding for the corresponding codeword 111 is fail. The preset threshold number may be decided in accordance with design requirements.

Figure 2:
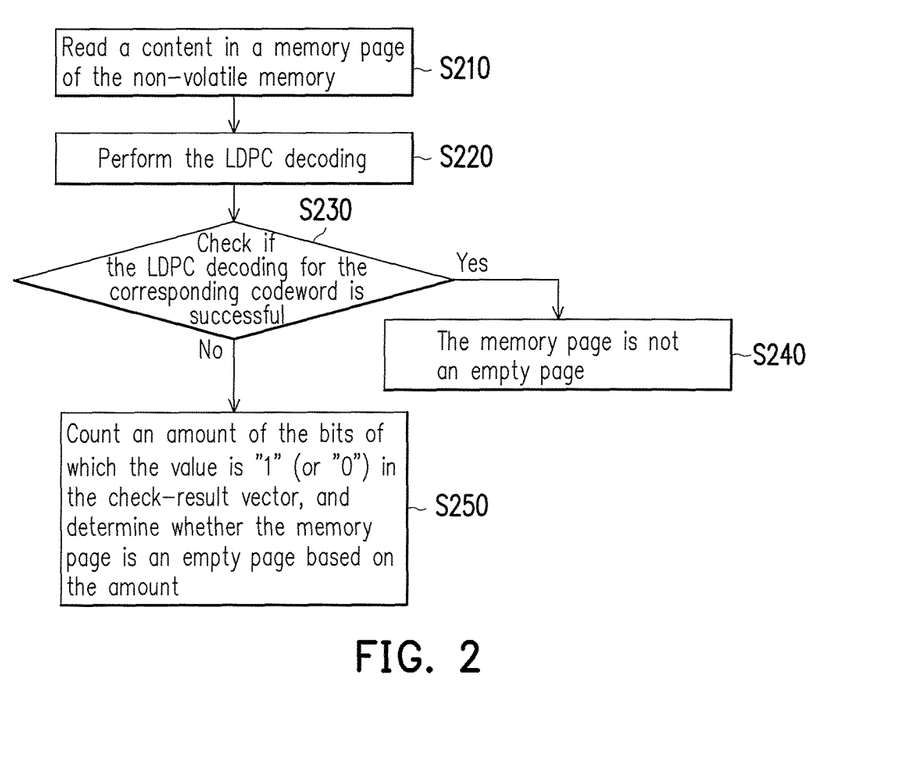
FIG. 2 illustrates a flowchart of an empty page detection method of the non-volatile memory apparatus according to the embodiment.

FIG. 2 illustrates a flowchart of the empty page detection method of the NVM apparatus according to the embodiment. The empty page detection method may determine whether a memory page of a NVM 110 is an empty pages or not. Please refer to FIGS. 1 and 2, in step S210, the controller 120 may read a content in a memory page of the NVM 110. In general, a memory page includes one or more codewords. In step S220, the controller 120 may perform the LDPC decoding for at least one codeword of the memory page to obtain a decoded codeword v and check-result vector $[c_0\ c_1\ \ldots\ c_{m-1}]$. In step S230, the controller 120 may check (determine) if the LDPC decoding for the corresponding codeword is successful. When the LDPC decoding for one or more codewords of the memory page is successful, the controller 120 may determine that the memory page is not an empty page (step S240).

In Step S230, when the LDPC decoding for the codeword is determined as fail, the controller 120, in step S250, may count an amount of the bits of which the value is "1" (or "0") in the check-result vector $[c_0\ c_1\ \ldots\ c_{m-1}]$, and determine whether the memory page is an empty page based on the (counted) amount. In other words, the controller 120 may count, among the elements $C_0$-$C_{m-1}$, how many elements having the value "1" (or "0"). For example, (for an 8-bit case, but not limited to), assuming that the check-result vector $[c_0\ c_1\ \ldots\ c_{m-1}]$ is [10011111], the amount of the bits being "1" in the check-result vector $[c_0\ c_1\ \ldots\ c_{m-1}]$ would be six (or the amount of the bits being "0" would be two). (There are two "0" bits and six "1" bits in the check-result vector [00001000]) For another example, assuming the check-result vector $[c_0\ c_1\ \ldots\ c_{m-1}]$ is [00001000], the amount of the bits being "1" in the check-result vector $[c_0\ c_1\ \ldots\ c_{m-1}]$ would be one (or the amount of the bits being "0" would be seven). Based on the amount of the bits being "1" (or "0") in the check-result vector $[c_0\ c_1\ \ldots\ c_{m-1}]$, the controller 120 may determine whether the memory page is an empty page (step S250). For example, in some embodiments, when the amount of the bits being "1" in the check-result vector $[c_0\ c_1\ \ldots\ c_{m-1}]$ is larger than a first threshold value Th1, in step S250, the controller 120 may determine that the memory page is the empty page. The first threshold value Th1 may be decided in accordance with design requirements. In other embodiments, when the amount of the bits being "0" in the check-result vector $[c_0\ c_1\ \ldots\ c_{m-1}]$ is smaller than a second threshold value Th2, in step S250, the controller 120 may determine that the memory page is an empty page. The second threshold Th2 may be decided in accordance with design requirements.

In the embodiment illustrated in FIG. 1, the controller 120 may include a central processing unit (CPU) 121, a random access memory (RAM) 122 and a LDPC decoder 123. After the host 10 issuing a read command, the CPU 121 may address the NVM 110 according to the read command such that the CPU 121 may read a corresponding codeword 111 from the NVM 110. The LDPC decoder 123 is coupled to the NVM 110, and the LDPC decoder 123 is configured to receive a content (e.g., the corresponding codeword 111) of the page memory of the NVM 110. The LDPC decoder 123 may perform a LDPC decoding for the codeword 111 of the memory page, thereby obtain a decoded codeword v and the check-result vector $[c_0\ c_1\ \ldots\ c_{m-1}]$.

In some embodiments, the RAM 122 is coupled to the LDPC decoder 123 to store the check-result vector $[c_0\ c_1\ \ldots\ c_{m-1}]$. The CPU 121 is coupled to the RAM 122 to read the check-result vector $[c_0\ c_1\ \ldots\ c_{m-1}]$. When the LDPC decoding for the codeword is successful, the CPU 121 may determine that the memory page is not an empty page. When the LDPC decoding for the codeword is fail, the CPU 121 may count an amount of the bits of which the value is "1" (or "0") in the check-result vector $[c_0\ c_1\ \ldots\ c_{m-1}]$. Based on the amount of the bits being "1" (or "0") in the check-result vector $[c_0\ c_1\ \ldots\ c_{m-1}]$, the CPU 121 may determine whether the memory page is an empty page. For example, when the amount of the bits being "1" in the check-result vector $[c_0\ c_1\ \ldots\ c_{m-1}]$ is larger than the first threshold value Th1 , the CPU 121 may determine that the memory page is an empty page. Or, when the amount of the bits being "0" in the check-result vector $[c_0\ c_1\ \ldots\ c_{m-1}]$ is smaller than the second threshold value Th2, the CPU 121 may determine that the memory page is an empty page.

In some other embodiments, when the LDPC decoding for the codeword is determined as fail, the LDPC decoder 123 may count an amount of the bits of which the value is "1" (or "0") in the check-result vector $[c_0\ c_1\ \ldots\ c_{m-1}]$. The RAM 122 is coupled to the LDPC decoder 123 to store the amount of the bits being "1" (or "0") in the check-result vector $[c_0\ c_1\ \ldots\ c_{m-1}]$. For example, (for an 8-bit case, but not limited to), assuming that the check-result vector $[c_0\ c_1\ \ldots\ c_{m-1}]$ is [10011111], the amount of the bits being "1" in the check-result vector $[c_0\ c_1\ \ldots\ c_{m-1}]$ would be 6 (or the amount of the bits being "0" would be 2). The check-result vector [10011111] would not be stored in the RAM 122, and the amount "6", which is the amount of the bits being "1" in the check-result vector [10011111], would be stored in the RAM 122. (or the amount "2", which is the amount of the bits being "0" in the check-result vector [10011111], would be stored in the RAM 122.) The CPU 121 is coupled to the RAM 122 to read the amount of the bits being "1" (or "0"). When the LDPC decoding for the codeword is successful, the CPU 121 may determine that the memory page is not an empty page. When the LDPC decoding for the codeword is fail, the CPU 121 may determine whether the memory page is an empty page according to the amount of the bits being "1" (or "0") in the check-result vector $[c_0\ c_1\ \ldots\ c_{m-1}]$.

Figure 3:
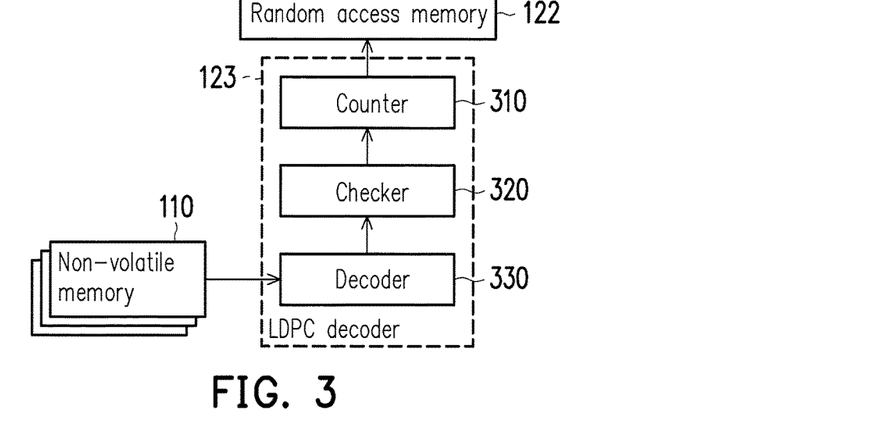
FIG. 3 illustrates a exemplary circuit block diagram illustrating a LDPC decoder in FIG. 1 according to the embodiment.

FIG. 3 illustrates a exemplary circuit block diagram illustrating a LDPC decoder in FIG. 1 according to the embodiment. In the embodiment illustrated in FIG. 3, the LDPC decoder 123 includes a counter 310, a checker 320 and a decoder 330. The decoder 330 is coupled to the NVM 110 to receive the content of the memory page. The decoder 330 may perform the LDPC decoding for the codeword of the memory page to obtain a decoded codeword v. The LDPC decoding is a well-known art, and would not be repeated here.

The checker 320 is coupled to the decoder 330 to receive the decoded codeword v. The checker 320 may perform a check operation for the decoded codeword v by using Equation 1 to generate a check-result vector $[c_0\ c_1\ \ldots\ c_{m-1}]$. The counter 310 is coupled to the checker 320 to receive the check-result vector $[c_0\ c_1\ \ldots\ c_{m-1}]$. The counter 310 may count the amount of the bits being "1" (or "0") in the check-result vector $[c_0\ c_1\ \ldots\ c_{m-1}]$. The amount of bits being "1" (or "0") would be stored in the RAM 122 for being accessed by the CPU 121.

Figure 4:
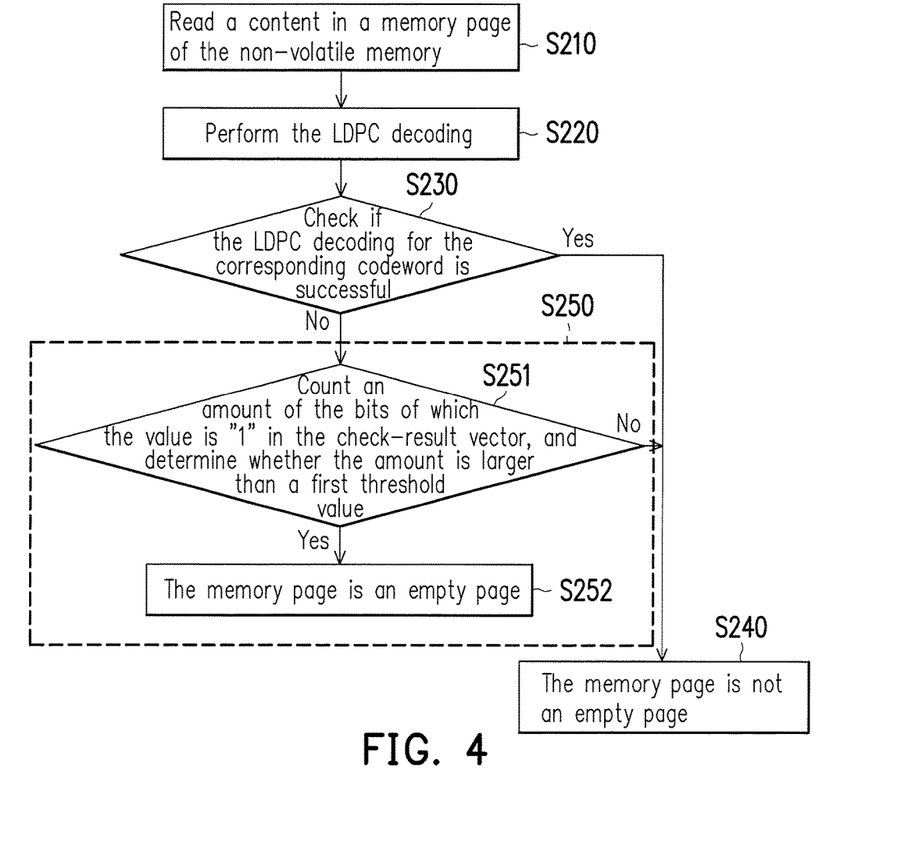

FIG. 4 illustrates a exemplary flowchart of the empty page detection method in FIG. 2 according to the embodiment. In the embodiment illustrated in FIG. 4, Step S250 includes sub-step S251 and S252. When the LDPC decoding for the codeword is determined as fail in step S230, the controller 120 may, in step S251, count an amount of the bits of which the value is "1" in the check-result vector $[c_0\ c_1\ \ldots\ c_{m-1}]$, and determine whether the (counted) amount is larger than a first threshold value. Namely, the controller 120 may count, among the elements $C_0$-$C_{m-1}$, how many elements having the value "1", and determine whether the counted amount is larger than the first threshold value Th1. When, in step S251, the amount of the bits being "1" in the check-result vector $[c_0\ c_1\ \ldots\ c_{m-1}]$ is determined not larger than the first threshold value Th1, the controller 120 may determine that the memory page is not an empty page in step S240. The first threshold Th1 may be decided in accordance with design requirements. When the amount of the bits being "1" in the check-result vector $[c_0\ c_1\ \ldots\ c_{m-1}]$ is larger than the first threshold value Th1, the controller 120 may perform step S252 to determine that the memory page is an empty page.

Figure 5:
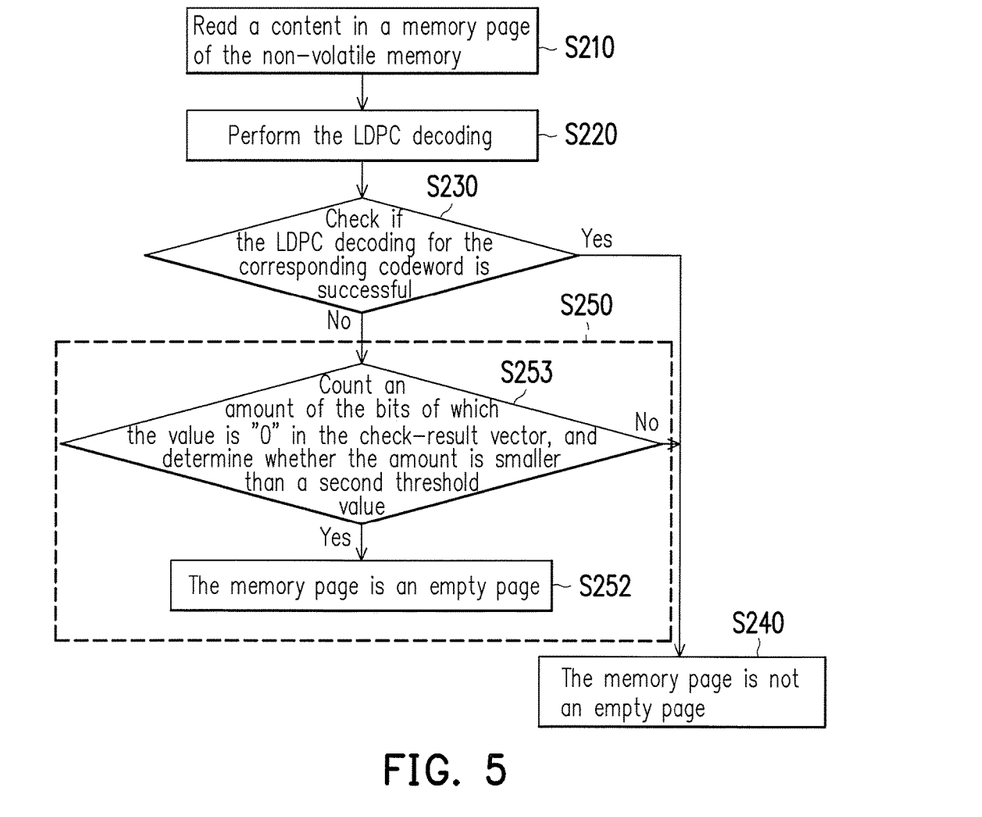
FIG. 5 illustrates a exemplary flowchart of the empty page detection method in FIG. 2 according to another embodiment.

FIG. 5 illustrates a exemplary flowchart of the empty page detection method in FIG. 2 according to another embodiment. In the embodiment illustrated in FIG. 5, Step S250 includes sub-step S253 and S252. When the LDPC decoding for the codeword is determined as fail in step S230, the controller 120 may, in step S253, count an amount of the bits of which the value is "0" in the check-result vector $[c_0 \, c_1 \ldots c_{m-1}]$, and determine whether the amount is smaller than a second threshold value Th2. Namely, the controller 120 may count, among the elements $C_0$-$C_{m-1}$, how many elements having the value "0", and determine whether the amount is smaller than the second threshold value Th2. When, in step S253, the amount of the bits being "0" in the check-result vector $[c_0 \, c_1 \ldots c_{m-1}]$ is determined not smaller than the second threshold value Th2, the controller 120 may perform step S240 to determine that the memory page is not an empty page. The second threshold Th2 may be decided in accordance with design requirements. When the amount of the bits being "0" in the check-result vector $[c_0 \, c_1 \ldots c_{m-1}]$ is smaller than the second threshold value Th2, the controller 120 may perform step S252 to determine that the memory page is an empty page.

Figure 6:
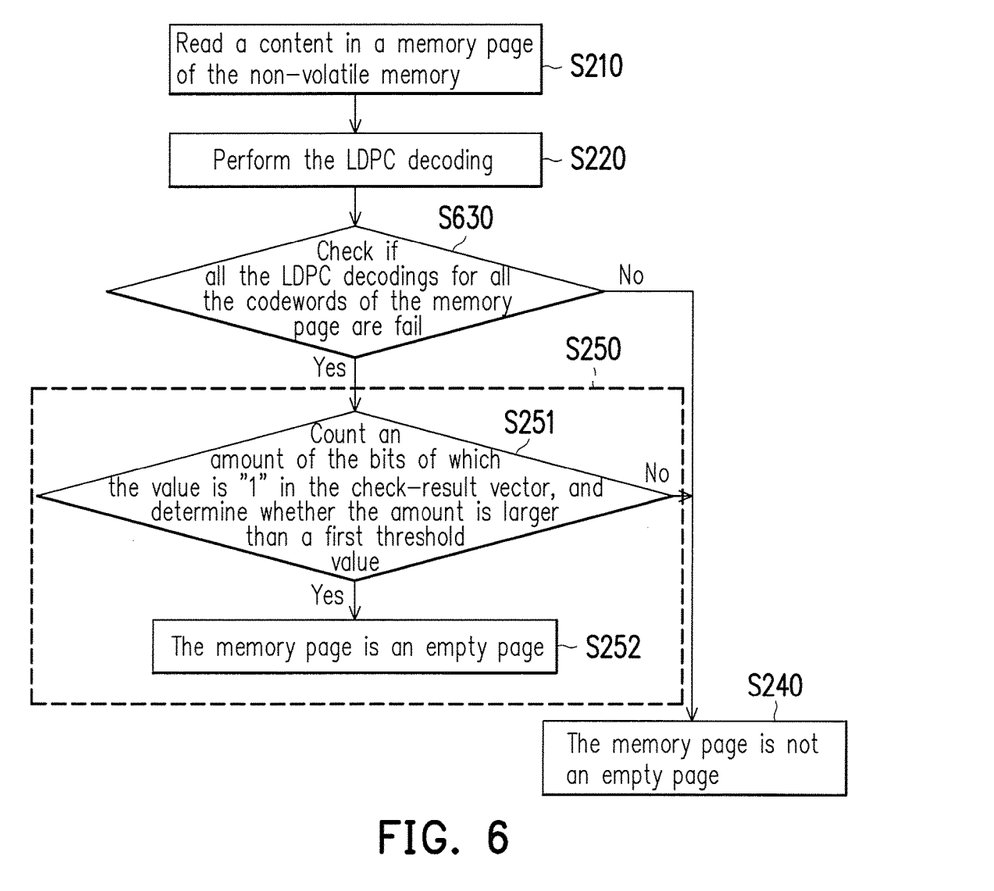
FIG. 6 illustrates a flowchart of an empty page detection method according to another embodiment.

FIG. 6 illustrates a flowchart of an empty page detection method according to another embodiment. The steps S210, S220, S240 and S250 illustrated in FIG. 6 may refer to the corrsponding description for steps S210, S220, S240 and S250 in FIG. 2, and would not be repeated here. In step S220, the controller 120 may perform the LDPC decoding for all codewords of the memory page. In step S630, the controller 120 may check whether all the LDPC decodings for all the codewords of the memory page are fail. When the LDPC decoding for one or more codewords of the codewords of the memory page is determined as successful in step S630, the controller 120 may determined that the memory page is not he empty page (Step S240). When all the LDPC decodings for all the codewords are determined as fail in step S630, the controller 120 may perform step S250 to determine whether the memory page is an empty page. In the embodiment illustrated in FIG. 6, step S250 includes sub-steps S251 and S252. The sub-steps S251 and S252 may refer to the related description for sub-steps S251 and S252 illustrated in FIG. 4, and would not be repeated here.

Figure 7:
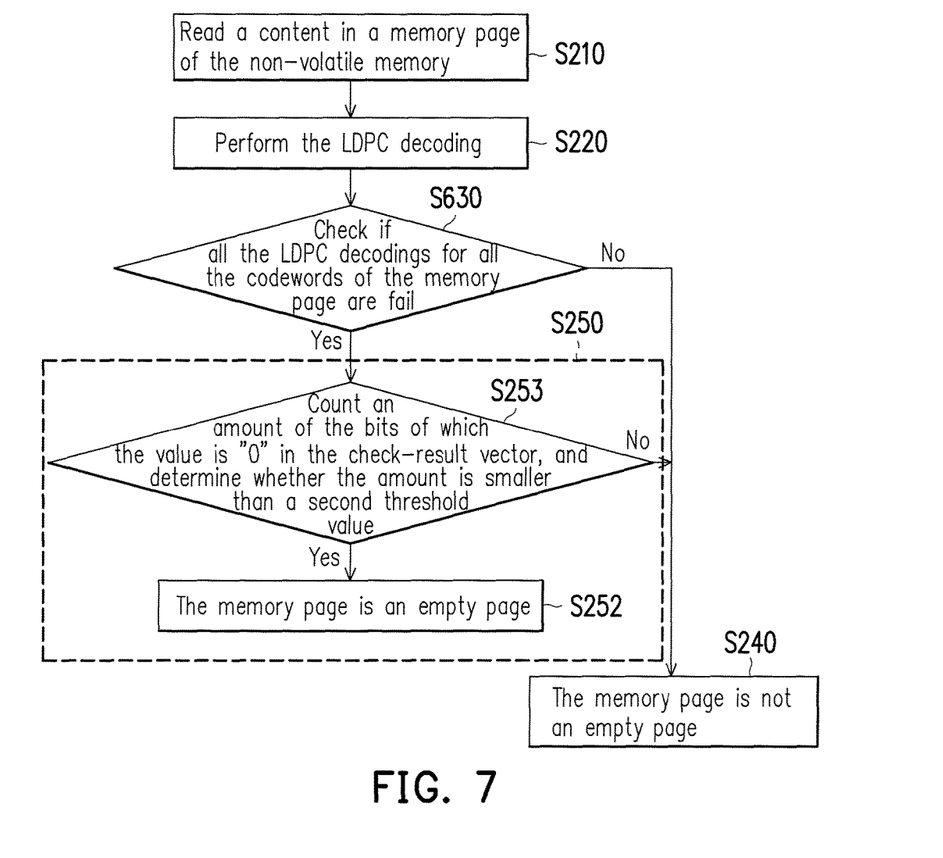
FIG. 7 illustrates a flowchart of an empty page detection method according to another embodiment.

FIG. 7 illustrates a flowchart of an empty page detection method according to another embodiment. The steps S210, S220, S240 and S250 illustrated in FIG. 7 may refer to the description for steps S210, S220, S240 and S250 in FIG. 2, and would not be repeated here. The steps S220 and S630 illustrated in FIG. 7 may refer to the description for steps S220 and S630 in FIG. 6, and would not be repeated here. When the LDPC decodings for all the codewords are determined as fail in step S630, the controller 120 may perform step S250 to determine whether the memory page is an empty page. In the embodiment illustrated in FIG. 7, step S250 includes sub-steps S253 and S252. The sub-steps S253 and S252 in FIG. 7 may refer to the description for sub-steps S253 and S252 illustrated in FIG. 5, and would not be repeated here.

It should be noted, in the context of different applications, related function(s) of the controller 120, the CPU 121, the LDPC decoder 123, the counter 310, the checker 320 and/or the decoder 330 may utilize general programming language (such as C or C++), hardware description language (such as Verilog HDL or VHDL) or other suitable programming language to be implemented as software, firmware or hardware. Said executable function associated software (or firmware) may be disposed in any known computer-accessible media, for example, magnetic Tapes, semiconductor memory, magnetic disks or CD (compact disks, such as CD-ROM or DVD-ROM), or via the Internet, a wired communication, wireless communication, or other communication medium transmitting the software (or firmware). The software (or firmware) can be stored in a computer-accessible medium such that computer processor may access/execute the software (or firmware) programming code. In addition, the apparatus and method of the present invention may be implemented by a combination of hardware and software.

In summary, Base on the foregoing description, the NVM apparatus and an empty page detection method provided in the present exemplary embodiments use the check-result vector of the LDPC decoding procedure. The controller may count an amount of bits being "1" (or "0") in the check-result vector when the LDPC decoding for the at least one codeword is fail. Accordingly, the controller may correctly determine whether the memory page is an empty page based on the amount of the bits being "1" (or "0") in the check-result vector. In the NVM apparatus having a scrambler, each of the bits of an empty page would not be "1" under the operation of the scrambler. An empty page detection method may be suitable for the NVM apparatus having the scrambler.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flash memory apparatus, comprising:
   a flash memory; and
   a controller, coupled to the flash memory, configured to perform an empty page detection method to determine whether a memory page of the flash memory is an empty page, wherein the empty page detection method comprises:
      reading, by the controller, a content of the memory page;
      performing, by the controller, a Low Density Parity Check (LDPC) decoding for at least one codeword of the read content of the memory page to obtain a decoded codeword and a check-result vector, wherein the check-result vector is calculated by multiplying the decoded codeword and a parity-check matrix through the performed LDPC decoding;
      determining, by the controller, whether the LDPC decoding for the at least one codeword is successful or unsuccessful according to the check-result vector, wherein
         when the obtained check-result vector is a zero vector, determining that the LDPC decoding for the at least one codeword is successful, and then further determining that the memory page corresponding to the at least one codeword is not an empty page, and
         when the obtained check-result vector is not the zero vector, determining that the LDPC decoding for the at least one codeword is unsuccessful, and then further determining whether the memory page corresponding to the at least one codeword is an empty page or not by one of two procedures, wherein the two procedures comprises:
            counting a first amount of bits with a value of 1 in the check-result vector, and determining that the memory page is an empty page when the first amount is larger than a first preset threshold, otherwise determining that the memory page is not an empty page, and
            counting a second amount of bits with a value of 0 in the check-result vector, and determining that the memory page is an empty page when the second amount is smaller than a second preset threshold, otherwise determining that the memory page is not an empty page.

2. The flash memory apparatus according to claim 1, wherein the controller comprises:
   a LDPC decoder, coupled to the flash memory to receive the content of the memory page, configured to perform the LDPC decoding for the at least one codeword of the read content of the memory page to obtain the decoded codeword and the check-result vector;
   a random access memory (RAM), coupled to the LDPC decoder to store the check-result vector; and
   a central processing unit (CPU), coupled to the RAM to read the check-result vector, wherein the CPU performs the step of determining whether the LDPC decoding for the at least one codeword is successful or unsuccessful according to the check-result vector.

3. The flash memory apparatus according to claim 1, wherein the controller comprises:
   a LDPC decoder, coupled to the flash memory to receive the content of the memory page, configured to perform the LDPC decoding for the at least one codeword of the read content of the memory page to obtain the decoded codeword and the check-result vector, wherein the LDPC decoder counts the first amount or the second amount when the LDPC decoding for the at least one codeword is determined as unsuccessful;
   a random access memory (RAM), coupled to the LDPC decoder, wherein the RAM is configured to store the counted first amount and the counted second amount; and
   a central processing unit (CPU), coupled to the RAM, wherein the CPU is configured to determine that the memory page is not an empty page when the LDPC decoding for at least one codeword is successful, and read the first amount or the second amount when the LDPC decoding for at least one codeword is unsuccessful,
   wherein the CPU determines that the memory page is an empty page when the first amount is larger than a first preset threshold, otherwise determines that the memory page is not an empty page,
   wherein the CPU determines that the memory page is an empty page when the second amount is smaller than a second preset threshold, otherwise determines that the memory page is not an empty page.

4. The flash memory apparatus according to claim 3, wherein the LDPC decoder comprises:
   a decoder, coupled to the flash memory to receive the content of the memory page, configured to perform the LDPC decoding for the at least one codeword of the read content of the memory page to obtain the decoded codeword;
   a checker, coupled to the decoder to receive the decoded codeword, configured to perform a check calculation for the decoded codeword to generate the check-result vector; and
   a counter, coupled to the checker to receive the check-result vector, configured to counts the first amount and the second amount.

5. An empty page detection method for determining whether a memory page of a flash memory in a flash memory apparatus is an empty page, wherein the flash memory apparatus comprises the flash memory and a controller, and the empty page detection method comprises:
   reading, by the controller, a content of the memory page;
   performing, by the controller, a Low Density Parity Check (LDPC) decoding for at least one codeword of the read content of the memory page to obtain a decoded codeword and a check-result vector, wherein the check-result vector is calculated by multiplying the decoded codeword and a parity-check matrix through the performed LDPC decoding;
   determining, by the controller, whether the LDPC decoding for the at least one codeword is successful or unsuccessful according to the check-result vector, wherein
      when the obtained check-result vector is a zero vector, determining that the LDPC decoding for the at least one codeword is successful, and then further determining that the memory page corresponding to the at least one codeword is not an empty page, and
      when the obtained check-result vector is not the zero vector, determining that the LDPC decoding for the at least one codeword is unsuccessful, and then further determining whether the memory page corresponding to the at least one codeword is an empty page or not by one of two procedures, wherein the two procedures comprises:

counting a first amount of bits with a value of 1 in the check-result vector, and determining that the memory page is an empty page when the first amount is larger than a first preset threshold, otherwise determining that the memory page is not an empty page, and counting a second amount of bits with a value of 0 in the check-result vector, and determining that the memory page is an empty page when the second amount is smaller than a second preset threshold, otherwise determining that the memory page is not an empty page.

\* \* \* \* \*